US012749798B2

(12) United States Patent
Acikalin et al.

(10) Patent No.: US 12,749,798 B2
(45) Date of Patent: Sep. 29, 2026

(54) WIRELESS INTERCONNECTS IN INTEGRATED CIRCUIT PACKAGE SUBSTRATES WITH GLASS CORES

(71) Applicant: Intel Corporation, Santa Clara, CA (US)

(72) Inventors: Tolga Acikalin, San Jose, CA (US); Tae Young Yang, Portland, OR (US); Shuhei Yamada, Vancouver, WA (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 18/334,201

(22) Filed: Jun. 13, 2023

(65) Prior Publication Data

US 2024/0421465 A1 Dec. 19, 2024

(51) Int. Cl.

| | |
|---|---|
| ***H01Q 1/22*** | (2006.01) |
| ***H01P 3/08*** | (2006.01) |
| ***H01Q 13/02*** | (2006.01) |
| ***H10W 70/60*** | (2026.01) |
| ***H10W 70/63*** | (2026.01) |
| ***H10W 70/692*** | (2026.01) |
| ***H10W 90/00*** | (2026.01) |

(52) U.S. Cl.

CPC ............. *H01Q 1/2283* (2013.01); *H01P 3/08* (2013.01); *H01Q 13/02* (2013.01); *H10W 70/611* (2026.01); *H10W 70/635* (2026.01); *H10W 70/692* (2026.01); *H10W 90/00* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 2014/0176368 A1* | 6/2014 | Kamgaing | H01Q 1/2283 | 29/601 |
| 2015/0130681 A1* | 5/2015 | Hsieh | H01Q 1/2283 | 343/895 |
| 2020/0196440 A1* | 6/2020 | Tseng | H05K 1/181 | |
| 2023/0208010 A1* | 6/2023 | Dogiamis | H01L 23/15 | 257/664 |

* cited by examiner

*Primary Examiner* — Sarah K Salerno

(74) *Attorney, Agent, or Firm* — Hanley, Flight & Zimmerman, LLC

(57) ABSTRACT

Wireless interconnects in integrated circuit package substrates with glass cores are disclosed. An example apparatus includes a semiconductor die. The example apparatus further includes a package substrate supporting the semiconductor die. The package substrate includes a glass core. The example apparatus also includes an antenna within the glass core.

19 Claims, 8 Drawing Sheets

WIRELESS INTERCONNECTS IN INTEGRATED CIRCUIT PACKAGE SUBSTRATES WITH GLASS CORES

FIELD OF THE DISCLOSURE

This disclosure relates generally to integrated circuit packages and, more particularly, to wireless interconnects in integrated circuit package substrates with glass cores.

BACKGROUND

Integrated circuit (IC) chips and/or semiconductor dies are routinely connected to larger circuit boards such as motherboards and other types of printed circuit boards (PCBs) via a package substrate. Integrated circuit (IC) chips and/or dies have exhibited reductions in size and increases in interconnect densities as technology has advanced.

Figure 1:
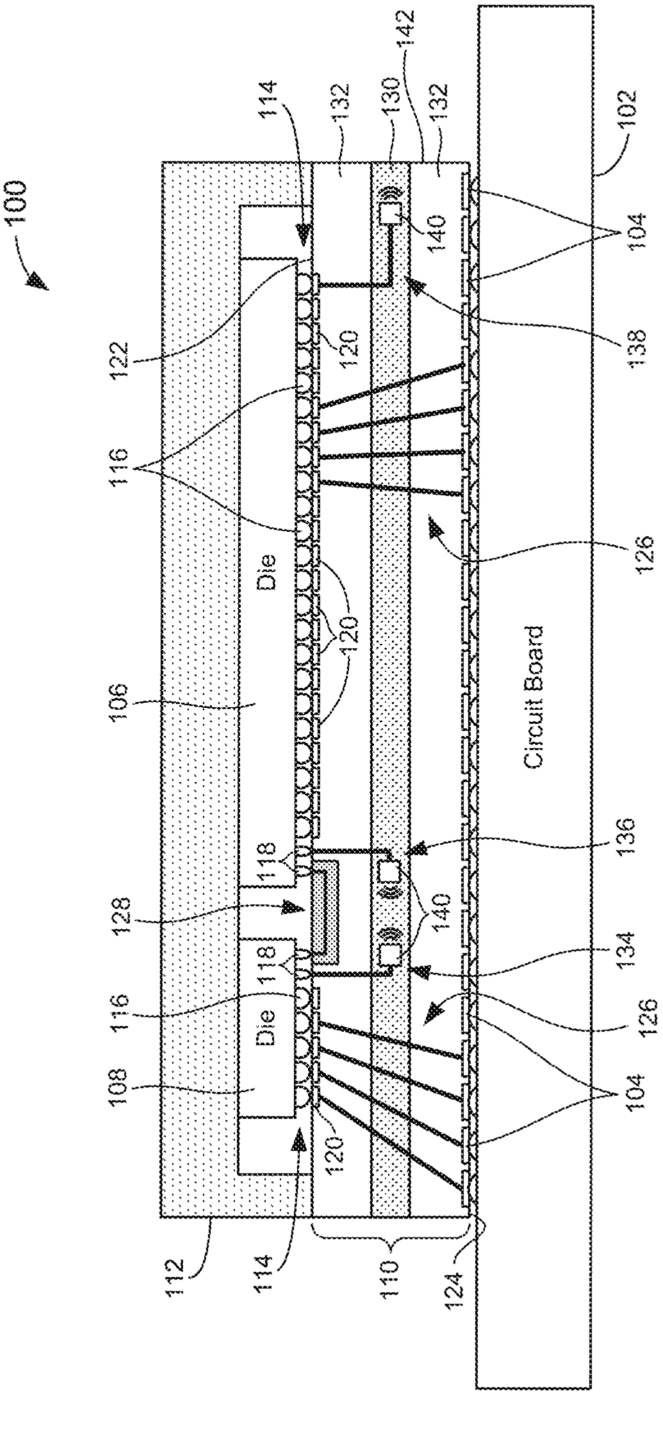
FIG. 1 illustrates an example integrated circuit (IC) package on a printed circuit board.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

FIG. 1 illustrates an example integrated circuit (IC) package 100 constructed in accordance with teachings disclosed herein. In the illustrated example, the IC package 100 is electrically coupled to a circuit board 102 (e.g., a printed circuit board (PCB), a motherboard, etc.) via an array of contact pads or lands 104 on a mounting surface 124 (e.g., a bottom surface) of the package 100. In some examples, the IC package 100 may include balls, pins, and/or pads, in addition to or instead of the contact pads 104, to enable the electrical coupling of the package 100 to the circuit board 102. In this example, the package 100 includes two semiconductor (e.g., silicon) dies 106, 108 (sometimes also referred to as chips or chiplets) that are mounted to a package substrate 110 and enclosed by a package lid or mold compound 112. While the example IC package 100 of FIG. 1 includes two dies 106, 108, in other examples, the package 100 may have only one die or more than two dies. In some examples, one of the dies 106, 108 (or a separate die) is embedded in the package substrate 110. The dies 106, 108 can provide any suitable type of functionality (e.g., data processing, memory storage, etc.). As one specific example, the IC package 100 may correspond to programmable circuitry such as a microprocessor and the dies 106, 108 correspond to separate cores of the processor.

As shown in the illustrated example, each of the dies 106, 108 is electrically and mechanically coupled to the substrate 110 via corresponding arrays of interconnects 114. In FIG. 1, the interconnects 114 are shown as bumps. However, the interconnects 114 may be any other type of electrical connection in addition to or instead of the bumps shown (e.g., balls, pins, pads, wire bonding, etc.). The electrical connections between the dies 106, 108 and the substrate 110 (e.g., the interconnects 114) are sometimes referred to as first level interconnects. By contrast, the electrical connections between the IC package 100 and the circuit board 102 (e.g., the pads 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to interconnects (e.g., balls, bumps, pins, pads, wire bonding, etc.) between a die and a package substrate or a die and an underlying die and/or interposer.

As shown in FIG. 1, the interconnects 114 of the first level interconnects include two different types of bumps corresponding to core bumps 116 and bridge bumps 118. As used herein, the core bumps 116 are bumps on the dies 106, 108 through which electrical signals pass between the dies 106, 108 and components external to the IC package 100. More particularly, as shown in the illustrated example, when the dies 106, 108 are mounted to the package substrate 110, the core bumps 116 are physically connected and electrically coupled to contact pads 120 on an inner surface 122 of the substrate 110. The contact pads 120 on the inner surface 122 of the package substrate 110 are electrically coupled to the landing pads 104 on the bottom (external) surface 124 of the substrate 110 (e.g., a surface opposite the inner surface 122) via internal interconnects 126 within the substrate 110. As a result, there is a continuous electrical signal path between the interconnects 114 of the dies 106, 108 and the landing pads 104 mounted to the circuit board 102 that pass through the contact pads 120 and the interconnects 126 provided therebetween.

As used herein, the bridge bumps 118 are bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 128 embedded in the package substrate 110. As represented in FIG. 1, core bumps 116 are typically larger than bridge bumps 118. In some examples, the interconnect bridge 128 and the associated bridge bumps 118 are omitted.

In FIG. 1, the substrate 110 of the example IC package 100 includes a glass substrate, layer, or core 130 between two separate build-up layers or regions 132. In some examples, glass substrates (e.g., the glass core 130) include quartz, fused silica, and/or borosilicate glass. In some examples, glass substrates (e.g., the glass core 130) includes at least 20% (by weight) of each of silicon (Si) and oxygen (O). In other examples, glass substrates (e.g., the glass core 130) includes greater amounts of at least one of silicon or oxygen (e.g., at least 25 wt %, at least 30 wt %, at least 35 wt %, at least 40 wt %, etc.). In some examples, glass substrates (e.g., the glass core 130) includes at least 5% (by weight) of aluminum (Al). In accordance with the present disclosure, glass substrates (e.g., the glass core 130) include at least one glass layer and do not include epoxy and do not include glass fibers (e.g., do not include an epoxy-based prepreg layer with glass cloth). In some examples, glass substrates (e.g., the glass core 130) correspond to a single piece of glass that extends the full height/thickness of the core. In some examples, the glass core 130 has a rectangular shape that is substantially coextensive, in plan view, with the layers above and below the core (e.g., substantially coextensive with the build-up regions 132). Among other things, glass cores are advantageous over epoxy-based cores because glass is stiffer and, therefore, provides for greater mechanical support or strength for the package substrate. Thus, the glass core 130 is an example means for strengthening the package substrate.

The build-up regions 132 are represented in FIG. 1 as masses/blocks with the internal interconnects 126 extending in straight lines through the build-up regions 132 (and the glass core 130). However, FIG. 1 has been simplified for the sake of clarity and purposes of explanation. In practice, the interconnects are not necessarily straight. More particularly, in some examples, the build-up regions 132 are defined by alternating layers of dielectric material and layers of conductive material (e.g., a metal such as copper). The conductive (metal) layers serve as the basis for the internal interconnects 126 represented, in a simplified form, by straight lines as shown in FIG. 1. In some examples, the metal layers are patterned to define electrical routing or conductive traces that are electrically coupled between different metal layers by conductive (e.g., metal) vias extending through intervening dielectric layers. Further, the electrical routing or traces on either side of the glass core 130 may be electrically coupled by through-glass vias (TGVs) (e.g., copper plated vias) extending through the glass core 130.

In addition to the internal interconnects 126 (implemented by conductive traces, interconnecting metal vias, and TGVs) that electrically connect the contact pads 104, 120 on the opposing surfaces 122, 124 of the substrate 110, the example substrate 110 includes wireless interconnects 134, 136, 138. In this example, three wireless interconnects 134, 136, 138 are shown. However, in other examples, the package substrate 110 can have fewer (e.g., one or two) or more (e.g., four or more) wireless interconnects. As used herein, a wireless interconnect is an interconnect that includes one or more antenna elements or structures 140 to enable communications using radio frequency (RF) signals. In other words, wireless interconnects disclosed herein do not define a continuous physical wiring path between end points for the transmission of signals and, instead, rely on RF signals for at least part of the communication path. However, wireless interconnects may still include metal wiring in some section(s) of the communication path (e.g., conductive traces, metal vias, TGVs, etc.) to interconnect the antenna structure(s) 140 to a given end point. In some examples, due to the relatively small size of the antenna structures 140, the RF signals are associated with relatively high frequencies such as those in the D band (e.g., 110 GHz to 170 GHz). However, higher and/or lower frequencies are also possible including, for example, the V band (e.g., 50 GHz to 75 GHz), the W band (e.g., 75 GHz to 110 GHz), the Y band (e.g., 170 GHz to 260 GHz), or higher (e.g., above 260 GHz).

As represented in FIG. 1, in some examples, the antenna structures 140 are embedded or otherwise provided in the glass core 130. Positioning the antenna structures 140 in the glass core 130 enables communication links to be established between components without using up space within the build-up regions 132. As a result, there is more space in the build-up regions 132 for other purposes (e.g., metal traces and/or routing for wired interconnects). In some examples, the antenna structures 140 may be implemented partially or fully within the build-up regions 132. Aside from the benefit of reducing limitations on space for conductive routing, wireless interconnects can also provide additional bandwidth to what may be achieved by wired connections for a given substrate size (e.g., a given number of metal layers in the build-up regions 132). Examples disclosed herein not only reduce routing limitations within the build-up regions 132 of the package substrate 110, but can also reduce the overall size of the package by reducing the number of second level interconnects needed to connect the package 100 to the circuit board 102. This, in turn, can reduce the size and/or complexity of the circuit board 102 and/or a socket on the circuit board and can also reduce insertion loss. Another advantage of implementing wireless interconnects 134, 136, 138 with antenna structures 140 at least partially within a glass core 130 is that it reduces (e.g., avoids) the signal integrity issues that arise for high frequency, off-package data links otherwise achieved by plated though holes in standard core materials (e.g., epoxy-based prepreg). In other words, examples disclosed herein reduce limitations associated with wired connections that involve routing that is either (1) serial high-speed routing at the cost of using low loss PCB materials or (2) low speed parallel routing at the cost of PCB real estate.

In some examples, two or more antenna structures 140 within the substrate 110 are constructed and located to communicate with one another. For instance, in the illustrated example of FIG. 1, the antenna structures 140 of the first and second wireless interconnects 134, 136 communicate with one another. Thus, wireless interconnects can be used to communicatively couple separate dies (e.g., the dies 106, 108) within the package 100 (e.g., inter-package communication links). In this example, the first and second wireless interconnects 134, 136 are shown as electrically coupled to separate bridge bumps 118. However, in other examples, one or both of the wireless interconnects 134, 136 could be connected to ones of the core bumps 116 (similar to the third wireless interconnect 138).

In some examples, wireless communication can be achieved internal to the IC package 100 (e.g., inter-package communication links) between two antenna structures 140 electrically coupled to components on either side of the glass core 130. For instance, a first antenna structure 140 is electrically coupled to one of the contact pads 104 on the external surface 124 of the package substrate 110 and a second antenna structure 140 is electrically coupled to one of the contact pads 120 on the inner surface 122 of the package substrate 110. Thus, such examples enable the transmission of signals through the package substrate without a TGV extending through the glass core 130.

In some examples, an antenna structure 140 is constructed and located to wireless communicate with a component external to and/or separate from the IC package 100 (e.g., intra-package communication links). For instance, in the illustrated example of FIG. 1, the antenna structure 140 of the third wireless interconnect 138 is positioned proximate an outer edge or perimeter 142 of the package 100 to wirelessly communicate with an adjacent component (e.g., a separate package). As a result, examples disclosed herein enable the transmission of signals between adjacent packages (or other electrical components) without needing to transmit those signals through traces in the underlying circuit board 102.

The antenna structures 140 associated with the wireless interconnects 134, 136, 138 disclosed herein can be implemented with any suitable size, shape, and/or design. Furthermore, implementing the antenna structures 140 within the glass core 130 provides more degrees of freedom for the shapes and sizes of metallic structures than can be built in packages using standard epoxy-based materials. Example designs and/or topologies for the antenna structures 140 include end-fire antennas arrays, horn antennas, TGV antennas and reflectors, phased array antennas (e.g., for off-package communication links), etc. In some examples, the antenna structures 140 may be directional (e.g., unidirectional) antennas to control the direction in which signals are transmitted and/or received. In other examples, the antenna structures 140 may be non-directional (e.g., omnidirectional) antennas that can broadcast and/or receive signals from any direction. Thus, there is significant flexibility in the communication links that can be established with the wireless interconnects disclosed herein including point-to-point communication links, and broadcast/multicast communication links. Further, in the context of multi-core processors, core level wireless interconnects can allow for module-to-module communication in applications such as in open compute platforms between accelerator modules that need to have one to many connectivity.

Figure 2:
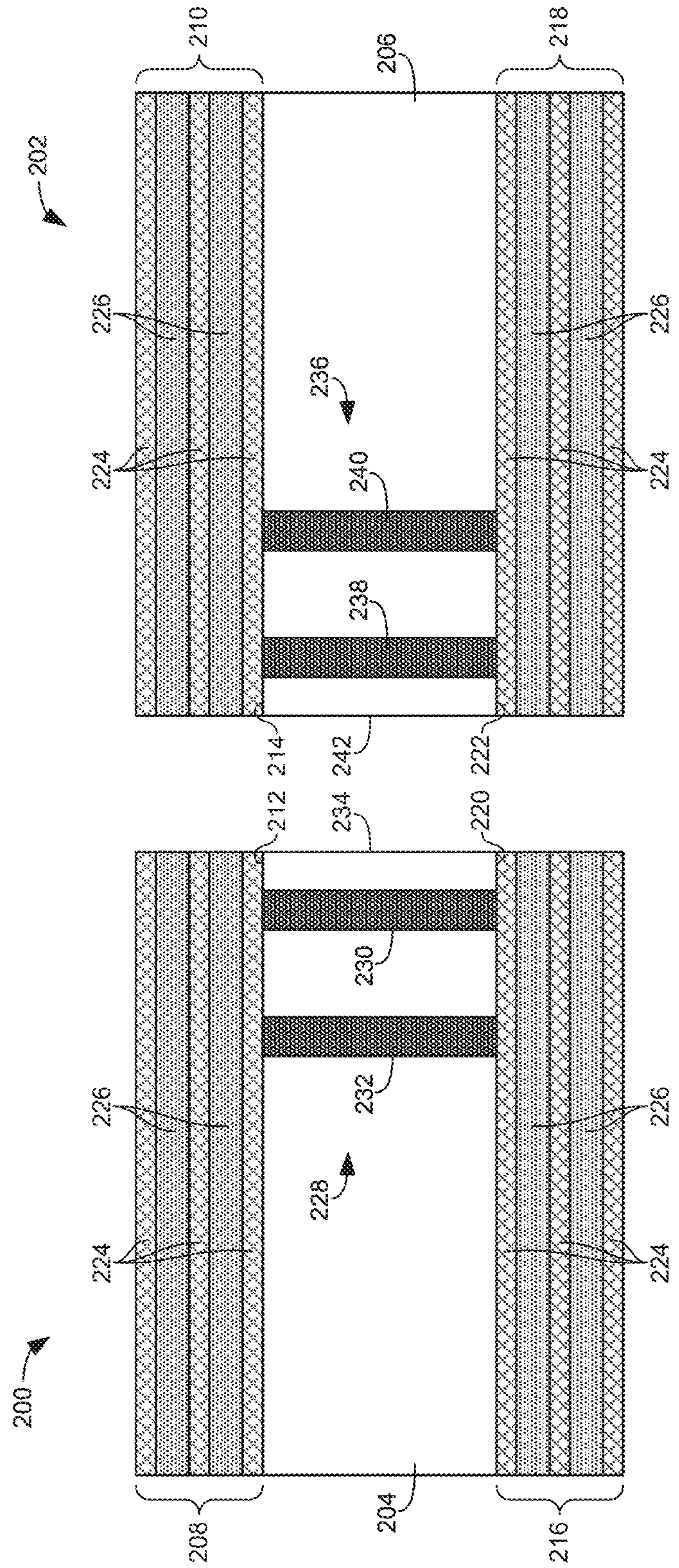
FIG. 2 is a cross-sectional side view of two example package substrates constructed in accordance with teachings disclosed herein and positioned in proximity with one another to enable wireless communications therebetween.

FIG. 2 is a cross-sectional view of two example package substrates 200, 202 constructed in accordance with teachings disclosed herein and positioned in proximity with one another to enable wireless communications therebetween. Either of the package substrates 200, 202 of FIG. 2 can serve as or correspond to the package substrate 110 of FIG. 1. As shown in FIG. 2, the package substrates 200, 202 include respective glass cores 204, 206, respective first build-up layers or regions 208, 210 on respective first sides 212, 214 of the glass cores 204, 206, and respective second build-up layers or regions 216, 218 on respective second sides 220, 222 of the glass cores 204, 206. In this example, each of the build-up regions 208, 210, 216, 218 includes three conductive (e.g., metal) layers 224 separated by two dielectric layers 226. In other examples, there may be fewer or more metal layers 224 and/or dielectric layers 226 than shown in the illustrated example. The metal layers 224 are shown extending continuously across the length or width of the glass cores 204, 206 for purposes of explanation and simplicity. That is, as discussed above, the actual location(s) of metal within the metal layers 224 may not be continuous and depends upon the way in which the metal has been patterned to define electrical traces, routing, contact pads, etc. Location(s) in which there is no metal in the metal layers 224 of FIG. 2 can be filled with the dielectric material associated with the dielectric layers 226 during the process of fabricating the build-up regions 208, 210, 216, 218 (e.g., via the successive lamination of the dielectric layers 226 onto the underlying metal layers 224 after lithographically patterning the metal in the underlying metal layer). Further, for the sake of simplicity, metal vias extending through the dielectric layers 226 have also been omitted in FIG. 2.

In the illustrated example of FIG. 2, the first package substrate 200 includes an antenna structure 228 disposed within the first glass core 204. In this example, the antenna structure 228 includes a radiating element 230 (e.g., a radiator, a driven element, a means for radiating) and a reflecting element 232 (e.g., a reflector, a parasitic element, a means for reflecting). In this example, both the radiating element 230 and the reflecting element 232 are implemented by corresponding through-glass vias (TGVs) extending through the glass core 204 from the first side 212 to the second side 220. In other examples, the radiating element 230 and/or the reflecting element 232 is implemented by a blind via that extends only part way through the glass core 204. As shown in FIG. 2, the antenna structure 228 is positioned proximate an outer (lateral) edge or perimeter 234 of the package substrate 200. Further, in this example, the radiating element 230 is closer to the perimeter 234 than the reflecting element 232 is to the perimeter 234. That is, the radiating element 230 is between the perimeter 234 of the package substrate 200 and the reflecting element 232. In this arrangement, the antenna structure 228 is configured or oriented to communicate in a direction pointing laterally away from the package substrate (e.g., beyond the edge or perimeter 234 in a direction away from a center of the package substrate 200 and/or a center of the glass core 204 within the package substrate 200).

In the illustrated example, the second package substrate 202 includes a second antenna structure 236 that is similar to or the same as the first antenna structure 228. That is, the second antenna structure 228 also includes a radiating element 238 and a reflecting element 240, with the radiating element 238 closer to an outer edge or perimeter 242 of the second package substrate 202. As a result, when the two substrates 200, 202 are positioned adjacent to one another, as shown, the first antenna structure 228 in the first package substrate 200 is able to wirelessly communicate with the second antenna structure 236 in the second package substrate 202. The two substrates 200, 202 may be positioned adjacent to each other by associated IC packages containing the substrates 200, 202 being mounted adjacent to one another on an underlying circuit board (e.g., the circuit board 102 of FIG. 1). However, due to the antenna structures 228, 236 in the package substrates 200, 202, the associated packages can communicate without signals having to be routed down through the lower build-up regions 216, 218 and through the circuit board. As such, the illustrated example reduces congestion at the second level interconnects (electrically coupling the associated packages with the underlying circuit board). Additionally or alternatively, wireless communications through the antenna structures in glass cores can similarly reduce (e.g., avoid) the need for interconnects on the topside of an associated package (e.g., the side opposite the printed circuit board). Reducing and/or avoiding topside interconnects is beneficial because it reduces challenges and/or limitations in implementing thermal solutions to cool the associated package (e.g., with a heatsink placed on the topside of the package). Of course, packages constructed in accordance with teachings disclosed herein may still be communicatively coupled via routing in the circuit board and/or through topside interconnects in addition to the wireless coupling via the antenna structures 228, 236.

As described above, the antenna structures 228, 236 of the illustrated example are positioned proximate outer edges or perimeters 234, 242 of the package substrates to enable intra-packages communications. However, in other examples, the same arrangement of the two antenna structures 228, 236 may be implemented within the same glass core of the same substrate (e.g., within the first glass core 204 of the first package substrate 200). In some such examples, the two antenna structures 228, 236 point towards each other in the same arrangement as shown in FIG. 2. Thus, in such examples, at least one of the reflecting elements 232, 240 is closer to the outer edge or perimeter 234 of the substrate 200 than the corresponding radiating elements 230, 238 is to the outer edge or perimeter 234.

While an example arrangement and a particular design of the two antenna structures 228, 236 is shown in FIG. 2, many variations are possible. For instances, the thickness (e.g., diameter), spacing (e.g., pitch), and length of the TGVs implementing the radiating and reflecting elements 230, 232, 238, 240 can be implemented in any suitable manner depending on the particular application and associated frequencies involved. Further, in some examples, additional TGVs may be employed to serve as additional parasitic elements (and/or driven elements) of the antenna structures 228, 236 (e.g., to implement an antenna array). Further, in some examples, the antenna structures 228, 236 may be rotated or angled relative to the vertical arrangement shown in FIG. 2 to facilitate wireless communication in directions other than laterally (e.g., to enable intra-package wireless communications between IC packages stacked on top of one another rather than positioned side-by-side, to enable inter-package wireless communications along a signal path that is transverse to a plane of the glass core (e.g., between a first antenna structure in or near the upper build-up region 208 and a second antenna structure in or near the lower build-up region 216)). Further, glass cores provide manufacturing flexibility in that glass can be etched to provide cavities, vias, and/or other openings of any desired shape, which can then be plated by metal. Thus, any suitable shape or design for the antenna structures is possible to implement any suitable type of antenna. For instance, example types of antennas that may be implemented in accordance with teachings disclosed herein include horn antennas, dipole antennas, yagi antennas, and loop antennas. Some examples of more complicated designs for antenna structures than what is shown in FIG. 2 are detailed below in connection with FIGS. 3-7.

Figure 3:
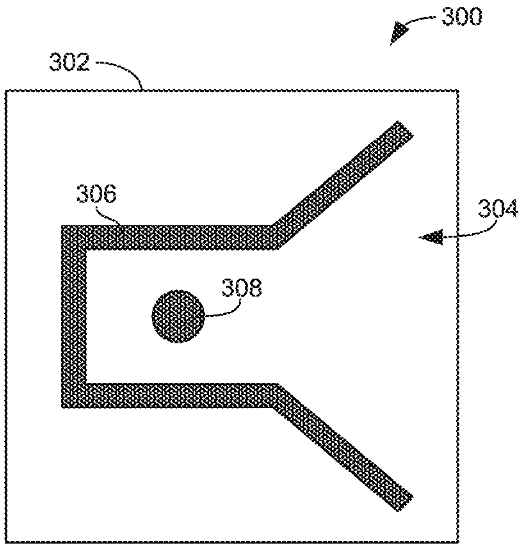
FIG. 3 is a top-down cross-sectional view of a glass core of an example package substrate constructed in accordance with teachings disclosed herein.

FIG. 3 is a top-down cross-sectional view of an example package substrate 300 that includes a glass core 302 containing another example antenna structure 304. The package substrate 300 of FIG. 3 can serve as or correspond to the package substrate 110 of FIG. 1. In this example, the antenna structure 304 corresponds to a high gain horn antenna defined by a solid wall horn 306 (e.g., a horn reflecting element, a horn reflector, a means for reflecting) that surrounds a radiating element 308 (e.g., a radiator, a driven element, a means for radiating). The radiating element 308 is implemented by a metal plated via extending through the glass core 302 (e.g., a TGV similar to radiating element 230 shown in FIG. 2). The solid wall horn 306 is defined by trenches in the glass core 302 that have been filled (e.g., plated) with metal. The example antenna structure 304 of FIG. 3 can be constructed with horizontal and/or vertical topologies depending on the particular use case for the antenna structure 3-4.

Figure 4:
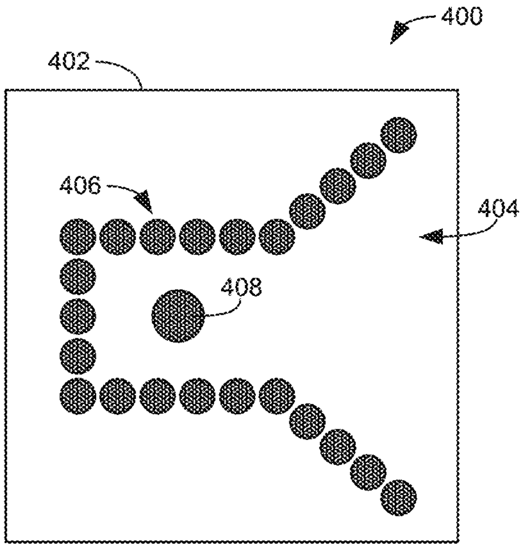
FIG. 4 is a top-down cross-sectional side view of a glass core of another example package substrate constructed in accordance with teachings disclosed herein.
Figure 6:
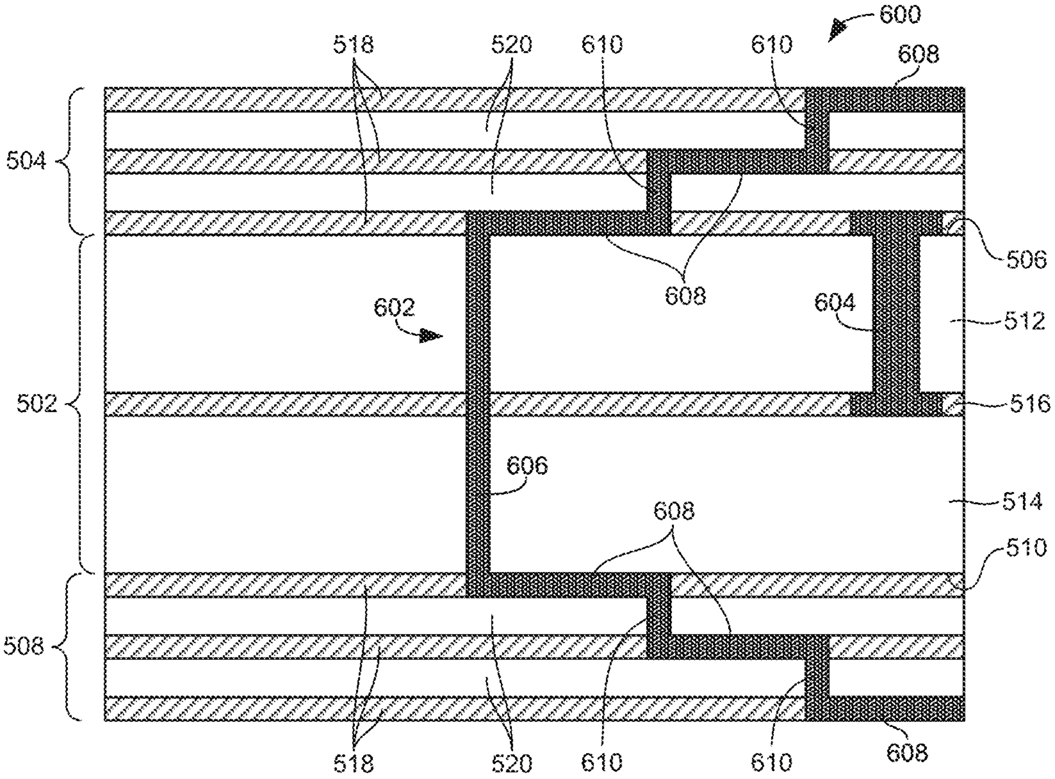
FIG. 6 is a cross-sectional side view of another example package substrate constructed in accordance with teachings disclosed herein.

FIG. 4 is a top-down cross-sectional view of an example package substrate 400 that includes a glass core 402 containing another example antenna structure 404. The package substrate 400 of FIG. 4 can serve as or correspond to the package substrate 110 of FIG. 1. In this example, the antenna structure 404 corresponds to a high gain horn antenna with a horn 406 with walls defined by an array of metal plated (e.g., metal filled) vias (e.g., TGVs) extending through the glass core 402 in a direction generally parallel to the via (e.g., TGV) used to implement a radiating element 408 of the antenna structure 404. Thus, the antenna structure 404 of FIG. 4 is substantially the same as the antenna structure 304 of FIG. 3 except that the horn 306 in FIG. 3 is defined by continuous solid walls whereas the horn 406 in FIG. 6 is defined by discrete, spaced apart vias. A solid wall horn antenna, as shown in FIG. 3, can yield improved performance relative to the horn antenna shown in FIG. 4 due to reduced leakage, higher gain, and better energy efficiency (particularly at mmW/THz frequencies). However, a solid wall horn can be more costly to fabricate due to the greater difficulty in etching trenches in the shape of the horn 306. Thus, there is a tradeoff between performance and cost between the antenna structures shown in FIGS. 3 and 4. In some examples, if the pitch or spacing between the discrete vias in the horn 406 shown in FIG. 4 are significantly less than the wavelength of radio waves to be communicated (e.g., less than half a wavelength, less than one tenth a wavelength), the disadvantages of the walls made of discrete vias can be substantially avoided.

Figure 5:
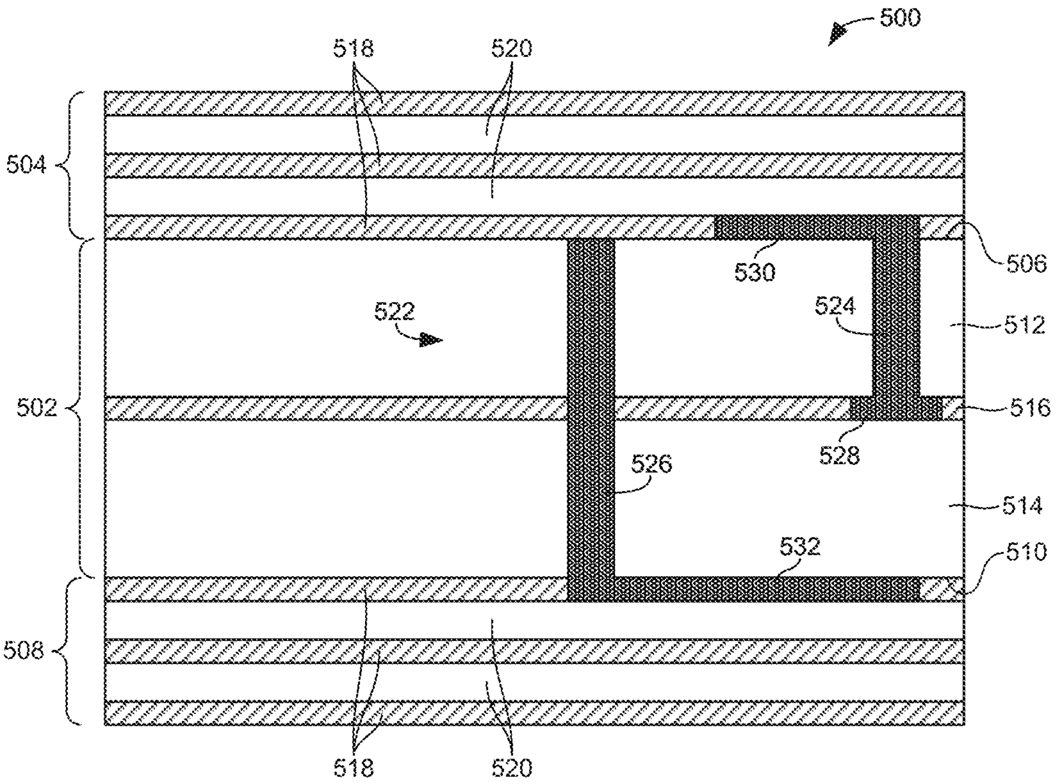
FIG. 5 is a cross-sectional side view of another example package substrate constructed in accordance with teachings disclosed herein.

FIG. 5 is a cross-sectional view of another example package substrate 500 constructed in accordance with teachings disclosed herein. The package substrate 500 of FIG. 5 can serve as or correspond to the package substrate 110 of FIG. 1. In the illustrated example of FIG. 5, the package substrate 500 includes a glass core 502, a first build-up layer or region 504 on a first side 506 of the glass core 502, and a second build-up layer or region 508 on a second side 510 of the glass core 502. As shown in the illustrated example, the glass core 502 is defined by two layers of glass 512, 514 with an intermediate layer 516 disposed therebetween. In some examples, the glass core 502 includes more than two layers of glass. The intermediate layer 516 can include any suitable low loss adhesive (e.g., AJINOMOTO BUILD-UP FILM™ (ABF) material) to facilitate the bonding of the two glass layers 512, 514. Further, in some examples, the intermediate layer 516 may also function as a metal layer with patterned metal disposed therein.

In this example, both of the build-up regions 504, 508 include three metal layers 518 separated by two dielectric layers 520. In other examples, there may be fewer or more metal layers 518 and/or dielectric layers 520 than shown in the illustrated example. Similar to the discussion above in connection with FIG. 2, the metal layers 518 are simplified for purposes of explanation and simplicity and may include various discrete portions (e.g., traces, pads, etc.) of metal within any given layer that may be interconnected between layers by metal vias that are not shown. Similarly, while the intermediate layer 516 is shown as a single continuous material, in some examples, portions of the intermediate layer 516 include metal while other portions include a dielectric material. In some examples, the intermediate layer 516 is omitted and the two glass layers 512, 514 are bonded directly together.

Using multiple glass layers 512, 514 to produce the full glass core 502, as shown in the illustrated example, can facilitate the manufacture of different designs and/or shapes for antenna structures by enabling lateral routing of metal between the individual glass layers 512, 514 and etching or otherwise processing the glass layers 512, 514 individually before assembly to provide different openings (e.g., vias, trenches, cavities, etc.) in different ones of the glass layers 512, 514. In this example, the glass layers 512, 514 have the same thickness. However, in other examples, the different glass layers 512, 514 may have different thicknesses to facilitate and/or refine the construction of different antenna topologies.

In the illustrated example of FIG. 5, an example antenna structure 522 is shown that spans across both glass layers 512, 514 of the glass core and into the build-up regions 504, 508. More particularly, the antenna structure 522 includes a radiating element 524 (e.g., a radiator, a driven element, a means for radiating) and a reflecting element 526 (e.g., a reflector, a parasitic element, a means for reflecting). In this example, the radiating element 524 is defined by a TGV extending through the first glass layer 512 but not the second glass layer 514. However, the radiating element 524 includes an enlarged tip 528 within the intermediate layer 516 at an end of the TGV radiating element 524. Further, the radiating element 524 includes an arm 530 that extends along the first side 506 of the glass core 502 within the first build-up region 504. The reflecting element 526 is implemented by a TGV extending through both glass layers 512, 514 (as well as the intermediate layer 516) of the glass core 502 and further includes an arm 532 extending along the second side 510 of the glass core in the second build-up region 508.

FIG. 6 is a cross-sectional view of another example package substrate 600 constructed in accordance with teachings disclosed herein. The package substrate 600 of FIG. 6 can serve as or correspond to the package substrate 110 of FIG. 1. The package substrate 600 of FIG. 6 is similar in construction to the package substrate 500 in FIG. 5. Therefore, the reference numbers in FIG. 5 are reproduced for corresponding components in FIG. 6 and the discussion of such components provided above in connection with FIG. 5 applies equally to FIG. 6. FIG. 6 differs from FIG. 5 in that the package substrate 600 of FIG. 6 includes a different example antenna structure 602. The example antenna structure 602 of FIG. 6 corresponds to a reflector antenna defined by a radiating element 604 (e.g., a radiator, a driven element, a means for radiating) and a reflecting element 606 (e.g., a reflector, a parasitic element, a means for reflecting). In this example, the antenna structure 602 extends across and beyond the glass core 502 and into the build-up regions 504, 508. More particularly, in this example, the reflecting element 606 includes different portions of metal 608 in multiple different metal layers 518 in the build-up regions 504, 508. Further, in this example, the different portions of metal 608 in the different metal layers 518 are interconnected by metal vias 610 extending through the dielectric layers 520. In some examples, at least some of the different portions of metal 608 are narrow traces. In other examples, at least some of the different portions of metal 608 are metal planes. Thus, many different architectures and designs for different types of antennas structures can be achieved in accordance with teachings disclosed herein. For instance, the architecture shown in FIG. 6 can allow for top and side feed points to the antenna structure 602 for dual polarization.

In some examples, multiple different antenna structures may be implemented within a single glass core. In some examples, the separate antenna structures correspond to independent antennas associated with separate communication channels. In some examples, two different antenna designs can be used in combination to improve system throughput and/or improve the signal-to-noise ratio. For instance, in some examples, two different polarization antennas, such as a TGV antenna and a dipole antenna, may be used to provide a dual-polarized antenna topology, thereby increasing the number of isolated streams or improving the signal integrity. In a similar manner, phased array antennas can also be constructed to improve signal integrity and/or to enable beam forming capabilities to realize reconfigurable channels.

In some examples, for intra-package communication links (e.g., wireless communications within a single package (e.g., between different chips or dies in a multi-chip package such as a multi-core processor)), different antenna structures can be arranged to provide a point-to-multipoint network between different chips or dies. That is, in some examples, a first antenna structure associated with a first chip is able to simultaneously transmit (broadcast/multicast) signals to multiple other antenna structures associated with corresponding ones of multiple other chips within the same package. Such an approach can significantly reduce the electrical routing that would be needed to communicatively interconnect the different chips in a complete mesh network using physical wiring to provide dedicated connections directly between each node in the network. Specifically, in a four-node network, each of the four nodes employs a direct connection with each of the other three nodes resulting in a total of six connections. The space saved by eliminating the electrical routing for these six connections through wireless communications between the nodes in accordance with teachings disclosed herein can be used for other electrical routing, thereby increasing IO bandwidth. Additionally or alternatively, eliminating these physically wired connections can enable a reduction in the thickness (e.g., by eliminating layers of metal otherwise needed for the routing) and/or the overall footprint of the associated package. Further, in some examples, intra-package wireless communications (e.g., communications within a single package) can enable multiple smaller chips or dies (e.g., cores) to be tiled together to serve the function of a single larger chip or die. Such an approach can improve the overall package yield, thereby reducing fabrication costs.

Figure 7:
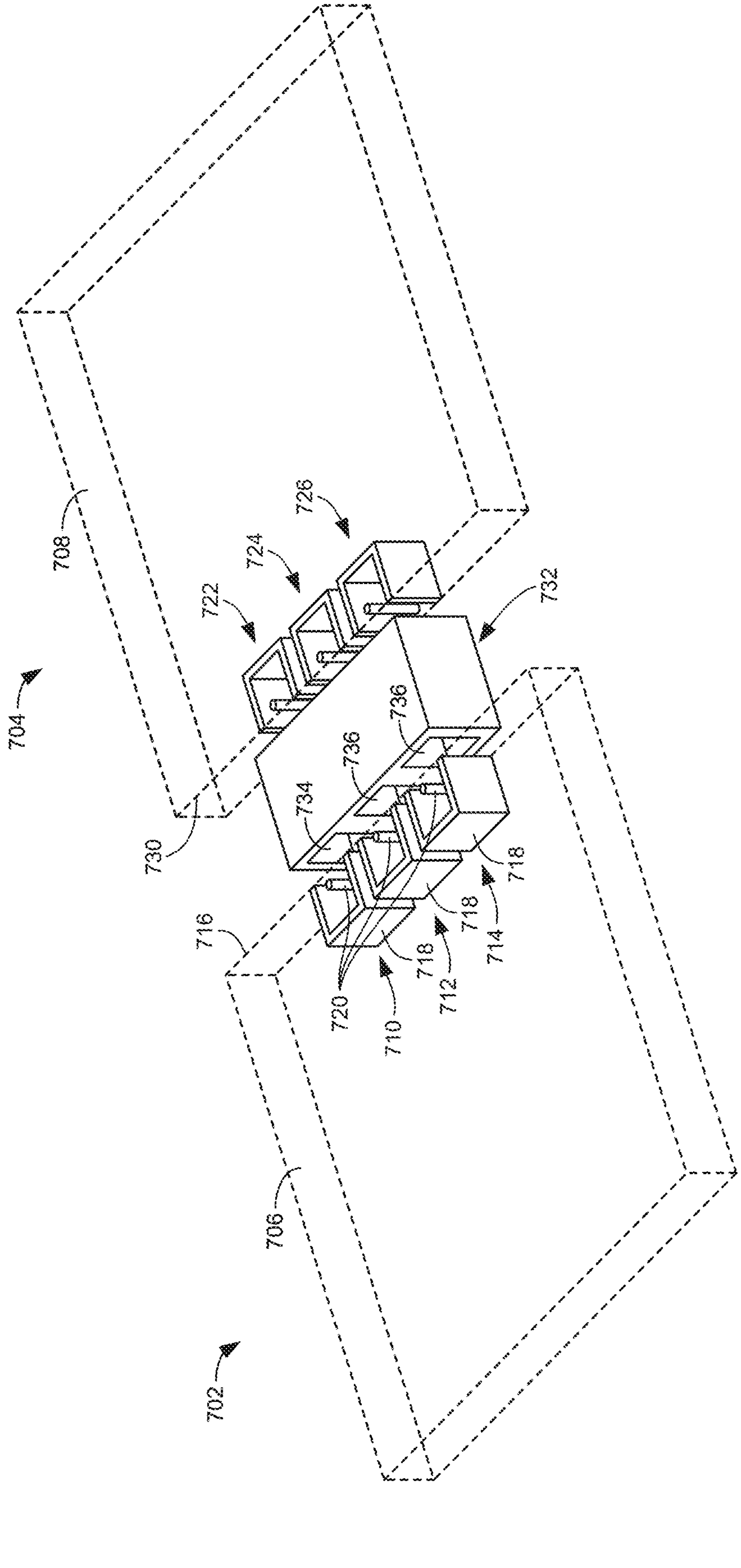
FIG. 7 illustrates two example packages communicatively coupled via wireless interconnects in accordance with teachings disclosed herein.

In addition to having multiple antenna structures within a single package for intra-package communications, some examples disclosed herein include multiple antenna structures within a single package to enable inter-package communications with multiple other packages and/or with a single separate package across multiple channels. Specifically, FIG. 7 illustrates two example packages 702, 704 communicatively coupled via wireless interconnects in accordance with teachings disclosed herein. In some examples, more than two packages can be in wireless communication. Either of the packages 702, 704 of FIG. 7 can serve as or correspond to the package 100 of FIG. 1. For purposes of illustration and explanation, only the glass cores 706, 708 of the respective packages 702, 704 are shown in FIG. 7, with the buildup regions and associated semiconductor dies omitted. In FIG. 7, the glass cores 706, 708 are shown with broken lines to represent that the glass cores 706, 708 are transparent such that the components embedded therein are visible. Specifically, in this example, the first glass core 706 of the first package 702 includes three antenna structures 710, 712, 714 corresponding to three separate communication channels. In this example, the antenna structures 710, 712, 714 are arranged in an array along a first edge 716 of the glass core 706. Each of the antenna structures 710, 712, 714 has a same design with a reflecting element 718 surrounding a corresponding radiating element 720. In other examples, different ones of the antenna structures 710, 712, 714 can have different designs. The second glass core 708 also includes three antenna structures 724, 726, 728 arranged in an array along a second edge 730 of the glass core 706. In this example, the three antenna structures 724, 726, 728 in the second glass core 708 have the same design and are similarly spaced as the three antenna structures 710, 712, 714 in the first glass core 706.

As shown in the illustrated example, the first edge 716 of the first glass core 706 and the second edge 730 of the second glass core 708 face towards one another and are adjacent to one another so that corresponding ones of the antenna structures 710, 712, 714, 722, 724, 726 are aligned with one another to define the wireless communication links for each of three separate channels. That is, the first antenna structures 710, 722 in both glass cores 706, 708 correspond to a first wireless channel, the second antenna structures 712, 724 in both glass cores 706, 708 correspond to a second wireless channel, and the third antenna structures 714, 726 in both glass cores 706, 708 correspond to a third wireless channel. Providing multiple channels in this manner enables an increase in data throughput between the two packages 702, 704.

In some examples, a waveguide assembly 732 is positioned between the antenna structures 710, 712, 714, 722, 724, 726 (e.g., between the two glass cores 706, 708 and between the two packages 702, 704) to provide isolation between the neighboring communication channels. In some examples, the waveguide assembly 732 is composed of metal and defines individual waveguides 734, 736, 738 (e.g., means for isolating wireless signals) corresponding to each of the three pairs of antenna structures 710, 712, 714, 722, 724, 726 associated with the three communication channels. In this example, the wave guide assembly 732 is a unitary component. However, in other examples, the waveguide assembly 732 can be implemented by multiple discrete components (e.g., each waveguide 734, 736, 738 implemented by a separate frame or housing).

In some examples, the two packages 702, 704 shown in FIG. 7 are two independent packages that are separately mounted to an underlying circuit board (e.g., the circuit board 102 of FIG. 1). In some such examples, the waveguide assembly 732 is also independent of the two packages 702, 704 and separately mounted to the circuit board. In other examples, the waveguide assembly 732 is integrated with and/or mounted to at least one of the packages 702, 704. In some examples, the waveguide assembly 732 is removably mounted adjacent (e.g., between) the packages 702, 704 (either removably attached to one or both of the packages 702, 704 and/or removably attached to an underlying circuit board or other substrate supporting the packages 702, 704). In other examples, the waveguide assembly 732 is permanently affixed to one or both of the packages 702, 704 and/or to an underlying circuit board or other substrate. As used herein, permanently affixed means the waveguide assembly 732 cannot be removed without damage to the waveguide assembly 732, the package(s) 702, 704, and/or the underlying circuit board or other substrate. In some examples, although initially independent, the two packages 702, 704 can be combined (along with the waveguide assembly 732) inside of a larger package.

Examples disclosed herein are not limited to wireless communications between packages 702, 704 as shown in FIG. 7. For instance, in other examples, antenna structures within a package are used to wirelessly communicate with antenna structures fabricated directly within the underlying circuit board (e.g., package-to-motherboard communications). Additionally or alternatively, in some examples, antenna structures within a package are used to communicate with any other component within communication range of the antenna structures (e.g., package-to-component communications). Furthermore, any wireless communication links between packages, circuit boards, and/or other components can be simplex, duplex, or a combination of both.

While several different example antenna structures 228, 236, 304, 404, 522, 602, 710, 712, 714, 722, 724, 726 are shown in FIGS. 2-7, many other designs, structures, architectures, and/or topologies are possible. Further, any of the aspects, features, or designs shown in any example antenna structure 228, 236, 304, 404, 522, 602, 710, 712, 714, 722, 724, 726 shown in FIGS. 2-7 can be combined with and/or used instead of the aspects, features, and/or designs of any other example antenna structure 228, 236, 304, 404, 522, 602, 710, 712, 714, 722, 724, 726 disclosed herein. Further, in addition to changes to the general design of the antenna elements, in some examples, different metal heights and/or cross-sectional shapes for the elements can be employed to create a distributed matching network for improved antenna performance.

The example wireless interconnects (e.g., based on any of the example antenna structures 228, 236, 304, 404, 522, 602, 710, 712, 714, 722, 724, 726) disclosed herein may be included in any suitable electronic component. FIGS. 8-11 illustrate various examples of apparatus that may include or be fabricated with the wireless interconnects disclosed herein.

Figure 8:
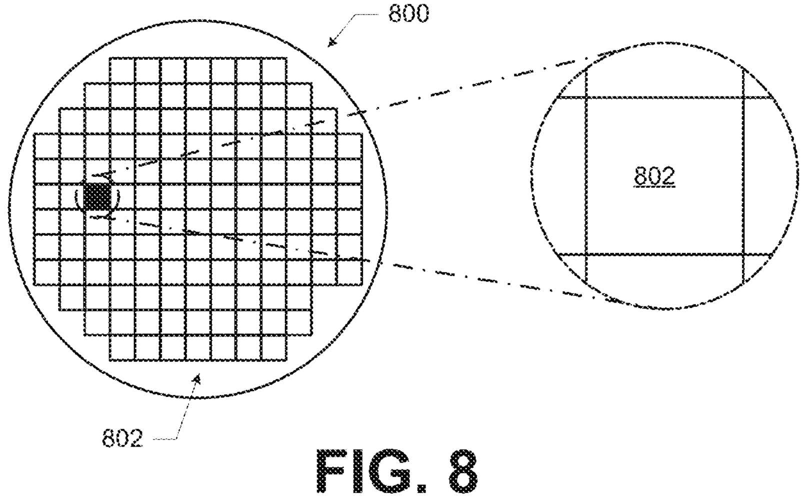
FIG. 8 is a top view of a wafer including dies that may be included in an IC package constructed in accordance with teachings disclosed herein.

FIG. 8 is a top view of a wafer 800 and dies 802 that may be included in the IC package 100 of FIG. 1 (e.g., as any suitable ones of the dies 106, 108). The wafer 800 may be composed of semiconductor material and may include one or more dies 802 having circuitry. Each of the dies 802 may be a repeating unit of a semiconductor product. After the fabrication of the semiconductor product is complete, the wafer 800 may undergo a singulation process in which the dies 802 are separated from one another to provide discrete "chips." The die 802 may include one or more transistors (e.g., some of the transistors 940 of FIG. 9, discussed below), supporting circuitry to route electrical signals to the transistors, passive components (e.g., traces, resistors, capacitors, inductors, and/or other circuitry), and/or any other components. In some examples, the die 802 may include and/or implement a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuitry. Multiple ones of these devices may be combined on a single die 802. For example, a memory array formed by multiple memory circuits may be formed on a same die 802 as programmable circuitry (e.g., the processor circuitry 1102 of FIG. 11) or other logic circuitry. Such memory may store information for use by the programmable circuitry. The example IC package 100 disclosed herein may be manufactured using a die-to-wafer assembly technique in which some dies are attached to a wafer 800 that include others of the dies, and the wafer 800 is subsequently singulated.

Figure 9:
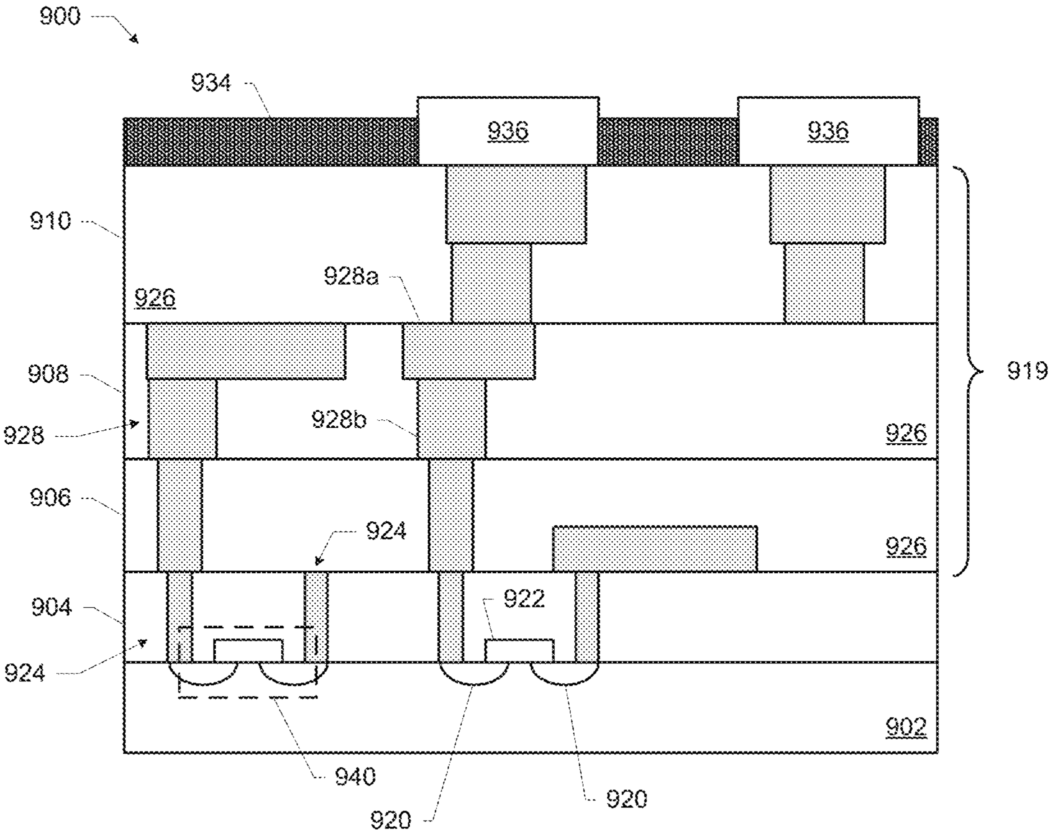
FIG. 9 is a cross-sectional side view of an IC device that may be included in an IC package constructed in accordance with teachings disclosed herein.

FIG. 9 is a cross-sectional side view of an IC device 900 that may be included in the example IC package 100 (e.g., in any one of the dies 106, 108). One or more of the IC devices 900 may be included in one or more dies 802 (FIG. 8). The IC device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some examples, the die substrate 902 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an IC device 900 may be used. The die substrate 902 may be part of a singulated die (e.g., the dies 802 of FIG. 8) or a wafer (e.g., the wafer 800 of FIG. 8).

The IC device 900 may include one or more device layers 904 disposed on or above the die substrate 902. The device layer 904 may include features of one or more transistors 940 (e.g., metal oxide semiconductor field-effect transistors (MOSFETs)) formed on the die substrate 902. The device layer 904 may include, for example, one or more source and/or drain (S/D) regions 920, a gate 922 to control current flow between the S/D regions 920, and one or more S/D contacts 924 to route electrical signals to/from the S/D regions 920. The transistors 940 may include additional features not depicted for the sake of clarity, such as device isolation regions, gate contacts, and the like. The transistors 940 are not limited to the type and configuration depicted in FIG. 9 and may include a wide variety of other types and/or configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other examples, at least one of the metal layers that form the gate electrode may simply be a planar layer that is substantially parallel to the top surface of the die substrate 902 and does not include sidewall portions substantially perpendicular to the top surface of the die substrate 902. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of each transistor 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920. In some implementations, the S/D regions 920 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 920 may be formed using one or more alternate semiconductor materials such as germanium or a group III-V material or alloy. In further examples, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the IC device 900.

The interconnect structures 928 may be arranged within the interconnect layers 906-910 to route electrical signals according to a wide variety of designs (in particular, the arrangement is not limited to the particular configuration of interconnect structures 928 depicted in FIG. 9). Although a particular number of interconnect layers 906-910 is depicted in FIG. 9, examples of the present disclosure include IC devices having more or fewer interconnect layers than depicted.

In some examples, the interconnect structures 928 may include lines **928*a* and/or vias 928*b* filled with an electrically conductive material such as a metal. The lines 928*a* may be arranged to route electrical signals in a direction of a plane that is substantially parallel with a surface of the die substrate 902 upon which the device layer 904 is formed. For example, the lines 928*a* may route electrical signals in a direction in and out of the page from the perspective of FIG. 9. The vias 928*b* may be arranged to route electrical signals in a direction of a plane that is substantially perpendicular to the surface of the die substrate 902 upon which the device layer 904 is formed. In some examples, the vias 928*b* may electrically couple lines 928*a* of different interconnect layers 906-910** together.

The interconnect layers 906-910 may include a dielectric material 926 disposed between the interconnect structures 928, as shown in FIG. 9. In some examples, the dielectric material 926 disposed between the interconnect structures 928 in different ones of the interconnect layers 906-910 may have different compositions; in other examples, the composition of the dielectric material 926 between different interconnect layers 906-910 may be the same.

A first interconnect layer 906 (referred to as Metal 1 or "M1") may be formed directly on the device layer 904. In some examples, the first interconnect layer 906 may include lines **928*a* and/or vias 928*b*, as shown. The lines 928*a* of the first interconnect layer 906 may be coupled with contacts (e.g., the S/D contacts 924) of the device layer 904**.

A second interconnect layer 908 (referred to as Metal 2 or "M2") may be formed directly on the first interconnect layer 906. In some examples, the second interconnect layer 908 may include vias **928*b* to couple the lines 928*a* of the second interconnect layer 908 with the lines 928*a* of the first interconnect layer 906. Although the lines 928*a* and the vias 928*b* are structurally delineated with a line within each interconnect layer (e.g., within the second interconnect layer 908) for the sake of clarity, the lines 928*a* and the vias 928*b*** may be structurally and/or materially contiguous (e.g., simultaneously filled during a dual-damascene process) in some examples.

A third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some examples, the interconnect layers that are "higher up" in the metallization stack 919 in the IC device 900 (i.e., further away from the device layer 904) may be thicker.

The IC device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to other external devices. For example, solder bonds may be formed on the one or more conductive contacts 936 to mechanically and/or electrically couple a chip including the IC device 900 with another component (e.g., a circuit board). The IC device 900 may include additional or alternate structures to route the electrical signals from the interconnect layers 906-910; for example, the conductive contacts 936 may include other analogous features (e.g., posts) that route the electrical signals to external components.

Figure 10:
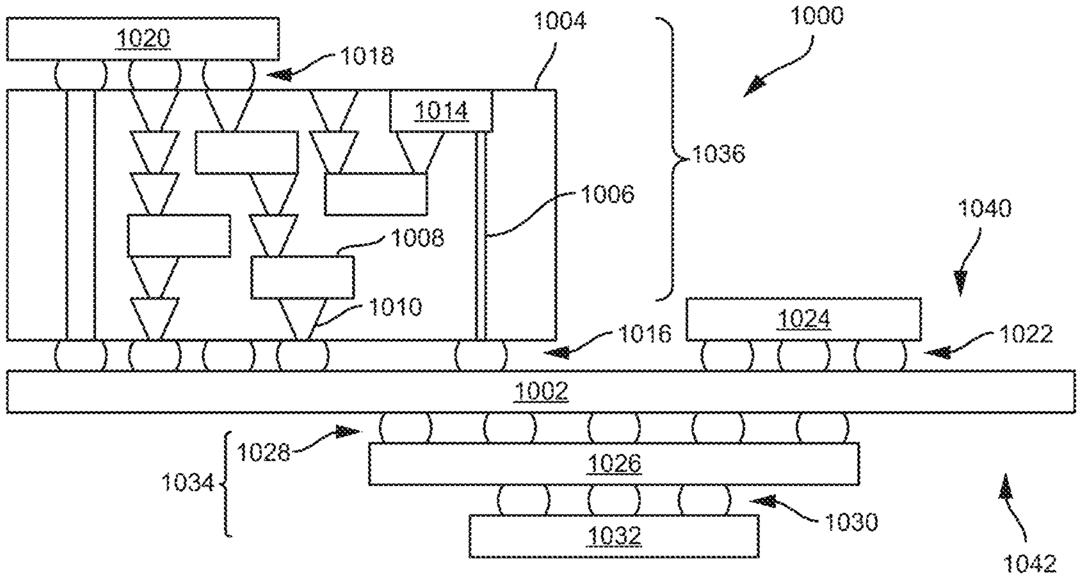
FIG. 10 is a cross-sectional side view of an IC device assembly that may include an IC package constructed in accordance with teachings disclosed herein.

FIG. 10 is a cross-sectional side view of an IC device assembly 1000 that may include the IC package 100 with wireless interconnects disclosed herein. In some examples, the IC device assembly corresponds to the IC package 100. The IC device assembly 1000 includes a number of components disposed on a circuit board 1002 (which may be, for example, a motherboard). The IC device assembly 1000 includes components disposed on a first face 1040 of the circuit board 1002 and an opposing second face 1042 of the circuit board 1002; generally, components may be disposed on one or both faces 1040 and 1042. Any of the IC packages discussed below with reference to the IC device assembly 1000 may take the form of the example IC package 100 of FIG. 1 with one or more wireless interconnects implemented therein.

In some examples, the circuit board 1002 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1002. In other examples, the circuit board 1002 may be a non-PCB substrate.

The IC device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), male and female portions of a socket, an adhesive, an underfill material, and/or any other suitable electrical and/or mechanical coupling structure.

The package-on-interposer structure 1036 may include an IC package 1020 coupled to an interposer 1004 by coupling components 1018. The coupling components 1018 may take any suitable form for the application, such as the forms discussed above with reference to the coupling components 1016. Although a single IC package 1020 is shown in FIG. 10, multiple IC packages may be coupled to the interposer 1004; indeed, additional interposers may be coupled to the interposer 1004. The interposer 1004 may provide an intervening substrate used to bridge the circuit board 1002 and the IC package 1020. The IC package 1020 may be or include, for example, a die (the die 802 of FIG. 8), an IC device (e.g., the IC device 900 of FIG. 9), or any other suitable component. Generally, the interposer 1004 may spread a connection to a wider pitch or reroute a connection to a different connection. For example, the interposer 1004 may couple the IC package 1020 (e.g., a die) to a set of BGA conductive contacts of the coupling components 1016 for coupling to the circuit board 1002. In the example illustrated in FIG. 10, the IC package 1020 and the circuit board 1002 are attached to opposing sides of the interposer 1004; in other examples, the IC package 1020 and the circuit board 1002 may be attached to a same side of the interposer 1004. In some examples, three or more components may be interconnected by way of the interposer 1004.

In some examples, the interposer 1004 may be formed as a PCB, including multiple metal layers separated from one another by layers of dielectric material and interconnected by electrically conductive vias. In some examples, the interposer 1004 may be formed of an epoxy resin, a fiberglass-reinforced epoxy resin, an epoxy resin with inorganic fillers, a ceramic material, or a polymer material such as polyimide. In some examples, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through-silicon vias (TSVs) 1006. The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The IC device assembly 1000 may include an IC package 1024 coupled to the first face 1040 of the circuit board 1002 by coupling components 1022. The coupling components 1022 may take the form of any of the examples discussed above with reference to the coupling components 1016, and the IC package 1024 may take the form of any of the examples discussed above with reference to the IC package 1020.

The IC device assembly 1000 illustrated in FIG. 10 includes a package-on-package structure 1034 coupled to the second face 1042 of the circuit board 1002 by coupling components 1028. The package-on-package structure 1034 may include a first IC package 1026 and a second IC package 1032 coupled together by coupling components 1030 such that the first IC package 1026 is disposed between the circuit board 1002 and the second IC package 1032. The coupling components 1028, 1030 may take the form of any of the examples of the coupling components 1016 discussed above, and the IC packages 1026, 1032 may take the form of any of the examples of the IC package 1020 discussed above. The package-on-package structure 1034 may be configured in accordance with any of the package-on-package structures known in the art.

Figure 11:
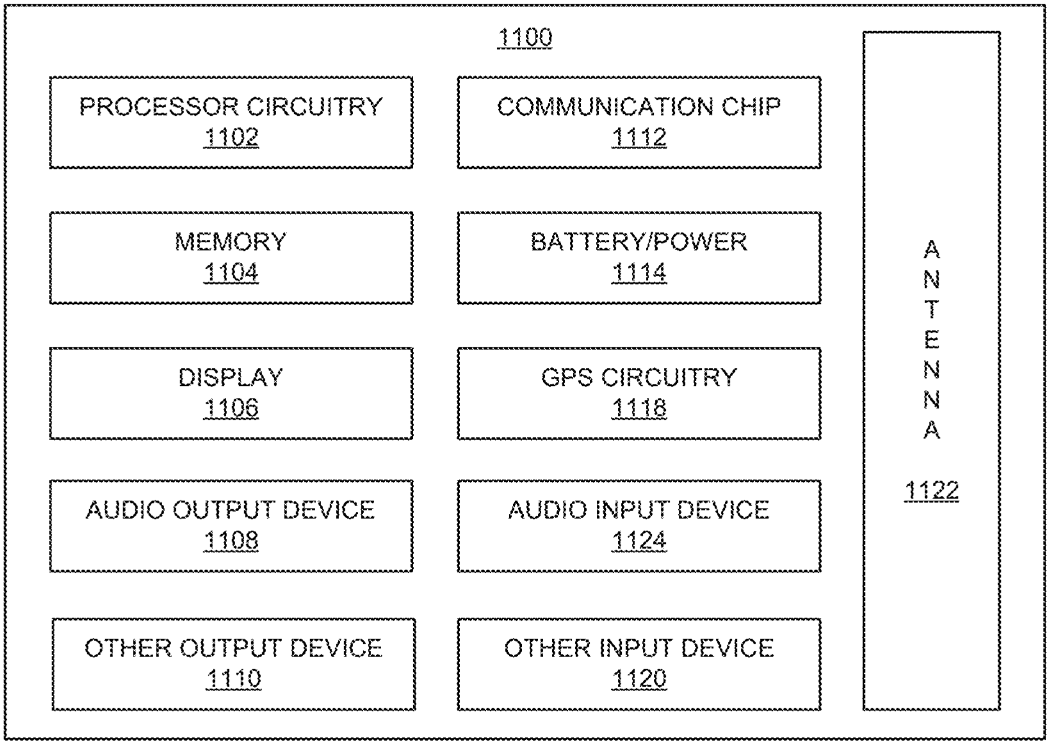
FIG. 11 is a block diagram of an example electrical device that may include an IC package constructed in accordance with teachings disclosed herein.

FIG. 11 is a block diagram of an example electrical device 1100 that may include one or more of the example IC package 100 with wireless interconnects. For example, any suitable ones of the components of the electrical device 1100 may include one or more of the device assemblies 1000, IC devices 900, or dies 802 disclosed herein, and may be arranged in the example IC package 100. A number of components are illustrated in FIG. 11 as included in the electrical device 1100, but any one or more of these components may be omitted or duplicated, as suitable for the application. In some examples, some or all of the components included in the electrical device 1100 may be attached to one or more motherboards. In some examples, some or all of these components are fabricated onto a single system-on-a-chip (SoC) die.

Additionally, in various examples, the electrical device 1100 may not include one or more of the components illustrated in FIG. 11, but the electrical device 1100 may include interface circuitry for coupling to the one or more components. For example, the electrical device 1100 may not include a display 1106, but may include display interface circuitry (e.g., a connector and driver circuitry) to which a display 1106 may be coupled. In another set of examples, the electrical device 1100 may not include an audio input device 1124 (e.g., microphone) or an audio output device 1108 (e.g., a speaker, a headset, earbuds, etc.), but may include audio input or output device interface circuitry (e.g., connectors and supporting circuitry) to which an audio input device 1124 or audio output device 1108 may be coupled.

The electrical device 1100 may include programmable circuitry 1102 (e.g., one or more processing devices). The programmable circuitry 1102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1100 may include a memory 1104, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1104 may include memory that shares a die with the programmable circuitry 1102. This memory may be used as cache memory and may include embedded dynamic random access memory (eDRAM) or spin transfer torque magnetic random access memory (STT-MRAM).

In some examples, the electrical device 1100 may include a communication chip 1112 (e.g., one or more communication chips). For example, the communication chip 1112 may be configured for managing wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1112 may operate in accordance with other wireless protocols in other examples. The electrical device 1100 may include an antenna 1122 to facilitate wireless communications and/or to receive other wireless communications (such as AM or FM radio transmissions).

In some examples, the communication chip 1112 may manage wired communications, such as electrical, optical, or any other suitable communication protocols (e.g., the Ethernet). As noted above, the communication chip 1112 may include multiple communication chips. For instance, a first communication chip 1112 may be dedicated to shorter-range wireless communications such as Wi-Fi or Bluetooth, and a second communication chip 1112 may be dedicated to longer-range wireless communications such as global positioning system (GPS), EDGE, GPRS, CDMA, WiMAX, LTE, EV-DO, or others. In some examples, a first communication chip 1112 may be dedicated to wireless communications, and a second communication chip 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display 1106 (or corresponding interface circuitry, as discussed above). The display 1106 may include any visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any device that generates an audible indicator, such as speakers, headsets, or earbuds.

The electrical device 1100 may include an audio input device 1124 (or corresponding interface circuitry, as discussed above). The audio input device 1124 may include any device that generates a signal representative of a sound, such as microphones, microphone arrays, or digital instruments (e.g., instruments having a musical instrument digital interface (MIDI) output).

The electrical device 1100 may include GPS circuitry 1118. The GPS circuitry 1118 may be in communication with a satellite-based system and may receive a location of the electrical device 1100, as known in the art.

The electrical device 1100 may include any other output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include any other input device 1120 (or corresponding interface circuitry, as discussed above). Examples of the other input device 1120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1100 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

From the foregoing, it will be appreciated that example systems, apparatus, articles of manufacture, and methods have been disclosed that enable wireless interconnects for wireless communication within an IC package (e.g., intra-package communications) and/or wireless communication between an IC package and some other component (e.g., inter-package communications). In some examples, the wireless communication is achieved through antenna structures fabricated within a glass core of a package substrate for the IC packages. In this way, the wireless communications is achieved using less real estate within build-up layers of the package substrate (e.g., by eliminating traces, vias, and/or other physical connection components), thereby enabling smaller packages, reducing congestion of (physical wire based) second level interconnects, and/or increasing IO bandwidth for a given package size.

Further examples and combinations thereof include the following:

Example 1 includes an apparatus comprising a semiconductor die, a package substrate supporting the semiconductor die, the package substrate including a glass core, and an antenna within the glass core.

Example 2 includes the apparatus of example 1, wherein the antenna is a first antenna, the apparatus further including a second antenna within the glass core, the second antenna spaced from the first antenna.

Example 3 includes the apparatus of example 2, wherein the first antenna is electrically coupled to the semiconductor die, and the second antenna is electrically coupled to a contact pad on the package substrate, the contact pad to enable the package substrate to be electrically coupled to a printed circuit board, the semiconductor die to transmit a signal to the contact pad corresponding to a radio frequency signal between the first and second antennas.

Example 4 includes the apparatus of example 2, wherein the semiconductor die is a first semiconductor die, the apparatus further including a second semiconductor die supported by the package substrate, the first semiconductor die to communicate with the second semiconductor die based on radio frequency signals between the first and second antennas.

Example 5 includes the apparatus of example 2, further including a third antenna within the glass core, the third antenna spaced from the first antenna and spaced from the second antenna, at least one of the first, second, and third antennas to broadcast signals to the others of the first, second, and third antennas.

Example 6 includes the apparatus of example 1, wherein the antenna is proximate an edge of the package substrate, the antenna pointing away from a center of the package substrate.

Example 7 includes the apparatus of example 6, wherein the semiconductor die and the package substrate are part of a first integrated circuit package, the apparatus further including a second integrated circuit package adjacent the edge of the package substrate of the first integrated circuit package, the semiconductor die to wirelessly communicate with the second integrated circuit package via the antenna.

Example 8 includes the apparatus of example 7, further including a waveguide between the first and second integrated circuit packages and adjacent to the antenna.

Example 9 includes the apparatus of example 1, wherein the antenna includes a horn surrounding a radiator.

Example 10 includes the apparatus of example 9, wherein the horn is defined by solid walls.

Example 11 includes the apparatus of example 9, wherein walls of the horn are defined by an array of through-glass vias in the glass core.

Example 12 includes the apparatus of example 1, wherein the antenna includes a radiator and a reflector, the radiator corresponding to a first through-glass via in the glass core, the reflector corresponding to a second through-glass via in the glass core.

Example 13 includes the apparatus of example 1, wherein the glass core includes a first glass layer and a second glass layer adjacent the first glass layer, a portion of the antenna between the first and second glass layers.

Example 14 includes an apparatus comprising a glass core, a first build-up region on a first side of the glass core, a second build-up region on a second side of the glass core, and an antenna within the glass core.

Example 15 includes the apparatus of example 14, wherein the antenna extends beyond the glass core into at least one of the first or second build-up regions.

Example 16 includes the apparatus of example 15, wherein the antenna includes a radiator, the radiator including an arm extending along a metal layer in the first build-up region, the metal layer adjacent the first side of the glass core.

Example 17 includes the apparatus of example 15, wherein the antenna includes a reflector, the reflector defined by metal in at least two layers in the first build-up region, the metal electrically coupled by a via extending through a dielectric layer in the first build-up region.

Example 18 includes an integrated circuit package comprising a semiconductor die, a package substrate supporting the semiconductor die, the package substrate including means for strengthening the package substrate, means for radiating a wireless signal, the means for radiating within the means for strengthening, and means for reflecting the wireless signal, the means for reflecting within the means for radiating.

Example 19 includes the integrated circuit package of example 18, wherein the means for radiating is adjacent an edge of the package substrate, the means for radiating between the edge of the package substrate and the means for reflecting, the integrated circuit package further including a means for isolating the wireless signal.

Example 20 includes the integrated circuit package of example 18, wherein the package substrate includes a build-up region between the semiconductor die and the means for strengthening, at least one of the means for radiating or the means for reflecting to extend into the build-up region.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:

a semiconductor die;

a package substrate supporting the semiconductor die, the package substrate including a glass core, the glass core having a first surface and a second surface opposite the first surface; and an antenna, at least part of the antenna between the first and second surfaces of the glass core, the antenna including a radiator and a reflector, the radiator corresponding to a first through-glass via in the glass core, the reflector corresponding to a second through-glass via in the glass core.

2. The apparatus of claim 1, wherein the antenna is a first antenna, the apparatus including a second antenna within the glass core, the second antenna spaced from the first antenna.

3. The apparatus of claim 2, wherein the first antenna is electrically coupled to the semiconductor die, and the second antenna is electrically coupled to a contact pad on the package substrate, the contact pad to enable the package substrate to be electrically coupled to a printed circuit board, the semiconductor die to transmit a signal to the contact pad corresponding to a radio frequency signal between the first and second antennas.

4. The apparatus of claim 2, wherein the semiconductor die is a first semiconductor die, the apparatus including a second semiconductor die supported by the package substrate, the first semiconductor die to communicate with the second semiconductor die based on radio frequency signals between the first and second antennas.

5. The apparatus of claim 2, including a third antenna within the glass core, the third antenna spaced from the first antenna and spaced from the second antenna, at least one of the first, second, and third antennas to broadcast signals to the others of the first, second, and third antennas.

6. An apparatus comprising:

a semiconductor die;

a package substrate supporting the semiconductor die, the package substrate including a glass core, the glass core having a first surface and a second surface opposite the first surface; and an antenna, at least part of the antenna between the first and second surfaces of the glass core, the antenna proximate to an edge of the package substrate, the antenna pointing away from a center of the package substrate.

7. The apparatus of claim 6, wherein the semiconductor die and the package substrate are part of a first integrated circuit package, the apparatus including a second integrated circuit package adjacent to the edge of the package substrate of the first integrated circuit package, the semiconductor die to wirelessly communicate with the second integrated circuit package via the antenna.

8. The apparatus of claim 7, including a waveguide between the first and second integrated circuit packages and adjacent to the antenna.

9. An apparatus comprising:

a semiconductor die;

a package substrate supporting the semiconductor die, the package substrate including a glass core, the glass core having a first surface and a second surface opposite the first surface; and an antenna, at least part of the antenna between the first and second surfaces of the glass core, the antenna including a horn surrounding a radiator.

10. The apparatus of claim 9, wherein the horn is defined by solid walls.

11. The apparatus of claim 9, wherein walls of the horn are defined by an array of through-glass vias in the glass core.

12. The apparatus of claim 9, wherein the glass core includes a first glass layer and a second glass layer adjacent to the first glass layer, a portion of the antenna between the first and second glass layers.

13. An apparatus comprising:

a glass core of a package substrate;

a first build-up region on a first side of the glass core;

a second build-up region on a second side of the glass core; and an antenna at least partially embedded within and in contact with the glass core, the antenna proximate to an edge of the package substrate, the antenna pointing away from a center of the package substrate.

14. The apparatus of claim 13, wherein the antenna extends beyond the glass core into at least one of the first or second build-up regions.

15. The apparatus of claim 13, wherein the antenna includes a radiator, the radiator including an arm extending along a metal layer in the first build-up region, the metal layer adjacent to the first side of the glass core.

16. The apparatus of claim 14, wherein the antenna includes a reflector, the reflector defined by metal in at least two layers in the first build-up region, the metal electrically coupled by a via extending through a dielectric layer in the first build-up region.

17. An integrated circuit package comprising:

a semiconductor die;

a package substrate supporting the semiconductor die, the package substrate including means for strengthening the package substrate;

means for radiating a wireless signal, the means for radiating within the means for strengthening; and means for reflecting the wireless signal, the means for reflecting within the means for radiating.

18. The integrated circuit package of claim 17, wherein the means for radiating is adjacent to an edge of the package substrate, the means for radiating between the edge of the package substrate and the means for reflecting, the integrated circuit package including a means for isolating the wireless signal.

19. The integrated circuit package of claim 17, wherein the package substrate includes a build-up region between the semiconductor die and the means for strengthening, at least one of the means for radiating or the means for reflecting to extend into the build-up region.

* * * * *